INVENTOR.
TONY HUEN
BY
[signature]
ATTORNEY

INVENTOR.
TONY HUEN

BY
[signature]

ATTORNEY

United States Patent Office 3,398,297
Patented Aug. 20, 1968

3,398,297
FREQUENCY CONVERTER USING LARGE SIGNAL SQUARE-LAW SEMICONDUCTOR

Tony Huen, Berkeley, Calif., assignor to the United States of America as represented by the United States Atomic Energy Commission Filed July 8, 1965, Ser. No. 470,654
12 Claims. (Cl. 307—220)

ABSTRACT OF THE DISCLOSURE

Large signal square-law cadmium sulphide crystal diode frequency conversion circuit in which a large signal square-law transformation between a full-wave rectified sinusoidal signal and a pure sinusoidal signal yields frequency multiplication or division.

The present invention relates to electronic circuitry for changing the frequency of sinusoidal electrical current signals and more particularly to circuitry for dividing or multiplying the frequency of an electrical signal.

A general procedure for changing the frequency of sinusoidal varying signals is to pass the sinusoidal signal through a nonlinear device to generate a multiplicity of harmonics. Selected filter arrangements are then employed to pass a particular harmonic while rejecting all other harmonics. Such conventional frequency changing schemes have the deficiency that they are not continuously tunable, and at low audio frequencies, require either bulky passive filtering components or complex active filter circuits. A well-known example of such a frequency changer is a class C tuned amplifier circuit adapted for example, to provide an output signal of a frequency at double the input signal frequency. Such electrical circuits are commonly referred to as "frequency doublers."

Conventional schemes for frequency dividing of sine waves usually employ pulse circuitry. In order to provide sinusoidal output signals from these pulse circuitry arrangements, it is generally necessary to employ tuned circuits which are plagued with the above-mentioned deficiencies that is, they have a narrow band of operating frequencies and are bulky, or expensively complex and unreliable in operation.

In the circuitry of one preferred embodiment of the present invention there is generated an almost pure second harmonic of a fundamental frequency sinusoidal signal so that filtering becomes essentially unnecessary. Thus the problems of bulky or complex filtering circuits are obviated. Since filtering is not required, those frequency limitations imposed by the narrow frequency bands of filters do not exist in circuitry embodying the present invention. The nature of the circuits of one class of the present invention are such that they can double any frequency in a continuous spectrum, e.g., from near zero to high frequencies. In theory, the upper useful frequency of any particular embodiment of the present invention is limited only by the transit time of charge carriers of the semiconductor components used to construct the circuit.

It has heretofore been known that a diode comprising a cadmium sulphide crystal having low trapping-level densities and provided with both an ohmic contact and a non-ohmic contact will exhibit a square law characteristic for one direction of current, i.e., diode current will be proportional to the square of the diode voltage for all voltage values of one polarity. See for example, G. T. Wright, "Some Properties and Applications of Space-Charge-Limited Currents in Insulating Crystals," Proceedings of the Institute of Electrical Engineers (London) May 1959, pp. 915–919. This phenomena is explained as a consequence of the "space charge limited" current flow in the bulk of the cadmium sulphide crystal and is not dependent on any P-N junction action in the crystal. It has been demonstrated that such a diode will exhibit this square law characteristic at least up to frequencies of 100 megacycles per second. G. T. Wright and J. Shao, "Characteristics of the S-C-L Dielectric Diode at Very High Frequencies," Solid State Electronics 3, p. 291; November-December 1961.

In accordance with the present invention it has been determined that if a fully rectified sine wave voltage is applied across a diode such that the non-ohmic junction is always biased positive with respect to the ohmic junction, the sole alternating component of the resulting current will be essentially a pure sine wave whose frequency is double that of the applied voltage before that voltage has been rectified. In general, any electronic circuit means which is adopted to impose a fully rectified sinusoidal voltage across the above-described diode in combination with means for detecting the alternating component of the resultant diode current will comprise one species of the present invention. As found in practice, some rather unique electronic circuitry is required to realize frequency doubling action with a square law diode. Several circuits which meet the above-recited specifications are described below in detail. Similarly circuitry wherein a sine wave current is forced through the square law diode and the voltage response is detected will comprise a second species of this invention capable of halving the frequency of a sinusoidal signal.

In one of its most favored forms, the present invention is comprised of a square law cadmium sulphide diode, unfiltered full wave rectifier means provided with output terminals coupled across the diode, and sensing means arranged to detect current developed in the diode.

Embodiments of the present invention may be cascaded so as to multiply "double" or multiply "halve" a sinusoidal frequency. In such a cascaded arrangement, the output frequency, $F_2$, may be expressed as follows: $F_2=F_1\times 2^N$ where $F_1$ is the frequency of a sinusoidal signal fed into the device and N is the number of cascaded stages, N being a negative number in the case of frequency halving operations and a positive number for frequency doubling operations. It is therefore an object of the present invention to provide an electronic device for changing the frequency of a sinusoidal electrical signal over a wide band of frequencies, and more particularly, from low frequencies near zero to high radio frequencies.

Another object of the present invention is to provide a device for doubling the frequency of sinusoidal signals. It is a further object of this invention to provide a frequency halving device which is continuously operable over a wide range of frequencies and which requires no electronic filtering circuits.

Still another object of the present invention is to provide frequency doubling and halving devices which may be cascaded to perform a series of doubling or halving operations.

More particularly it is an object of this invention to convert the frequency, $F_1$, of electrical sinusoidal signals to a second frequency, $F_2$, where $F_2=F_1\times 2^N$ where N is any positive or negative finite integral number.

The manner of achieving these and other objects will be more apparent to those skilled in the art from the following detailed description of preferred embodiments of the invention, taken in connection with the accompanying drawings in which:

FIGURE 1 schematically depicts a frequency doubler embodiment of the frequency changer of the present invention.

FIGURE 2 graphically and mathematically depicts square law operation of the diode of FIGURE 1.

FIGURE 3 schematically depicts a bridge circuit type frequency doubler embodiment of the frequency changer of the present invention.

FIGURE 4 is a block diagram setting forth a generic means for practicing the present invention.

FIGURE 5 schematically sets forth a second bridge type frequency doubler circuit embodying the concept of the present invention.

FIGURE 6 graphically and mathematically describes the operation of the frequency doubler of FIGURE 5.

Figure 2:
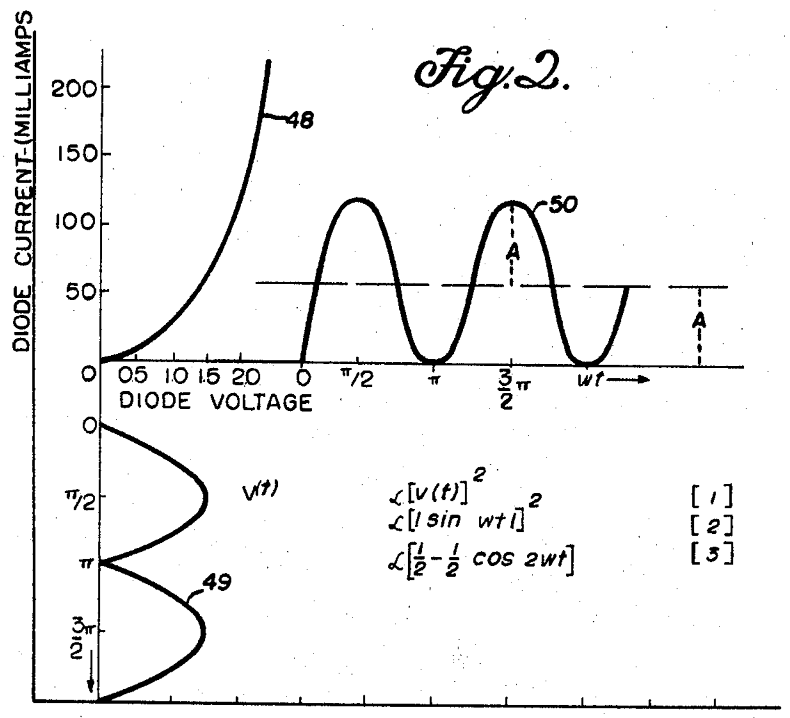

The numerous advantageous applications of the present invention are immediately apparent, considering, e.g., the communications field where frequency shifting operations are quite common. In such a field the present invention would be advantageous both because of its independence of bulky filter networks and also because of its continuously variable feature. As another area of immediate fruitful application, consider the modern electronic organs where it is often desirable to generate pure or multiple harmonics and subharmonics of a given fundamental frequency, and where cabinet space for the mounting of components is at a premium.

Further areas of advantageous use of the present invention are to be found in microwave power detection, in remote synchronization systems in phase-sensitive detection or demodulation of alternating current servomechanisms, and counting as well as manifold other applications such as time modulation.

As previously stated herein, the present invention generally comprises a circuit including means for applying a time varying signal to a semi-conductor device wherein the square law characteristic of devices such as cadmium sulphide crystals effect a shift in the frequency of the time varying signal. More particularly in FIGURE 1 there is shown a preferred embodiment of the invention operating as a sinusoidal frequency doubler comprising a cadmium sulphide crystal 12 driven by a Darlington connected transistor amplifier 13. Crystal 12 has an ohmic contact 14 connected to ground 16 and a non-ohmic contact 17 connected to the emitter 18 of output transistor 19 of the aforesaid amplifier 13. A constant current generator 20 is connected to said emitter 18 in order to bias amplifier 13 into the class A amplifying region. Resistor 21 is connected from positive voltage source 22 to base 23 of input transistor 24 of said amplifier 13. Resistor 25 is connected from base 23 to negative voltage source 26. These two resistors, 21 and 25, acting in combination with current source 20, serve to hold emitter 18 at ground potential in the absence of an input signal applied to base 23. Resistor 27 connects between positive voltage source 22 and the common junction of the collectors of transistors 19 and 24. The input signal to the frequency doubler is supplied by an unfiltered full wave rectifier 28 having a pair of output terminals 31 and 32 and which receives a sine wave voltage from sine wave voltage source 29. Terminal 31 is connected to base 23 of transistor 24 and terminal 32 is connected to ground 16. The output of the frequency doubler is coupled to the load via a capacitor 33 connected between the collector of transistor 19 and output terminal 34.

In one typical embodiment, constant current generator 20 was comprised of an NPN transistor 35 having a collector connected through resistor 36 to emitter 18 of transistor 19, having an emitter connected through resistor 37 to negative voltage source 26, and having a base connected through resistor 38 to ground 16. To maintain the base voltage of transistor 35 constant and hence its output current constant, a Zener diode 39 has its cathode connected to the base of transistor 35 and has its anode connected to voltage source 26.

One practical form of the unfiltered full wave rectifier 28 is as follows:

Transformer 41 has its primary winding connected to signal source 29. A secondary winding of transformer 41 has a first terminal connected to an anode of rectifier diode 42, a second terminal connected to an anode of rectifier diode 43, and a center tap terminal coupled through capacitor 44 to output terminal 32 and ground 16. A bias control potentiometer 45 has a first terminal connected to voltage source 22, a second terminal connected to ground 16, and a wiper arm terminal connected to the center tap terminal of transformer 41. The anodes of both diodes 42 and 43 connect through variable isolation resistor 46 to output terminal 31. Potentiometer 45 is adjusted so the quiescent voltages on the anodes of diodes 42 and 43 are equal to the quiescent voltage on their cathodes. This adjustment serves to eliminate undesirable "base line clipping" of the rectified signal.

In operation, unfiltered full wave rectifier 28 rectifies the sinusoidal signal from source 29 to provide a pulsating unidirectional voltage whose pulse repetition rate is double the frequency of the signal from source 29. This rectified signal is fed to base 23 of amplifier 13, a high-input-impedance Darlington-connected amplifier which serves to isolate low-impedance diode 12 from the signal source 29. This fully rectified signal is amplified in power but not in voltage and appears at emitter 18 of transistor 19 whereby a pulsating unidirectional voltage is impressed on junction 17 of diode 12. As will be explained more fully hereinafter, diode 12 converts the pulsating unidirection voltage to a pure sinusoidal waveform whose frequency is equal to the pulse repetition rate of the pulsating unidirectional voltage. All variations in current flow through diode 12 are carried by amplifier 13 and do not appear in constant current generator 20, the result of the inherent nature of a constant current generator. These current variations then appear in resistor 27 of amplifier 13 in the form of an alternating voltage. Now, the frequency of this sinusoidal waveform of voltage generated across resistor 27 is, by virtue of the square law characteristic of diode 12, double the frequency of the sinusoidal voltage generated by voltage source 29. If an unrectified sinusoidal voltage waveform is impressed on junction 17 of diode 12, each positive half cycle of the sinusoidal waveform will cause a full cycle sinusoidal variation in the current flow of diode 12. However, it is preferable that a fully rectified sinusoidal voltage be impressed on junction 17 of diode 12 in order that a continuous sinusoidal signal be generated. In the above-described circuit embodiment is seen that the entire circuit, i.e., unfiltered full wave rectifier and square-law device, operates as a doubler of the frequency of sinusoidal signals, the output of the frequency doubler circuit being a continuous sinusoidally varying signal.

Figure 1:
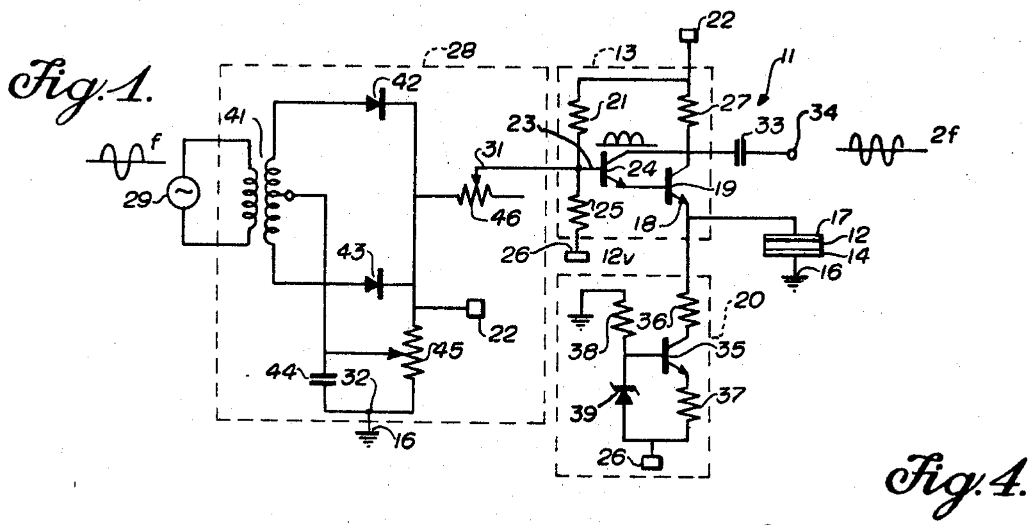

In one constructed form of the circuit of FIGURE 1, the following components were used:

| | |
|---|---|
| Transistors **19** & **35** | 2N1701. |
| Transistor **24** | 2N697. |
| Resistor **21** | 7000 ohms. |
| Resistor **25** | 20,000 ohms. |
| Resistor **27** | 14.7 ohms 1%. |
| Resistor **36** | 5.6 ohms. |
| Resistor **37** | 100 ohms. |
| Resistor **38** | 270 ohms. |
| Zener diode **39** | 1N748A (5.6 v.). |
| Voltage source **22** | +6 volts. |
| Voltage source **26** | −12 volts. |
| Diodes **42** & **43** | HD2151. |
| Capacitor **44** | 10 μf, 15 v. |
| Potentiometer **45** | 200 ohms. |
| Variable resistor **46** | 50,000 ohms. |

As an aid in understanding the principle of operation of the present invention, there is shown in FIGURE 2 a typical current-voltage characteristic curve of the square law diode 12 utilized in the circuitry of the present invention. Curve 48 shows that when non-ohmic contact 17 is biased positive with respect to ohmic contact 14 the diode current will vary as the square of diode voltage. Curve 49 represents a fully rectified sinusoidal wave form signal with its time axis shown vertically aligned and with its voltage axis horizontally aligned and superimposed upon the diode voltage axis of curve 48. Conventional graphical analysis techniques show that when the voltage depicted by curve 49 is impressed upon the square law diode having the characteristic shown by curve 48, there will be produced a current in the diode, which has a waveform similar to that depicted by curve 50, this current wave has a direct current (D.C.) component and an alternating current component. It is seen that the frequency of the alternating current (A.C.) component of current is double the frequency of the impressed voltage before rectification or equal to the pulse repetition rate of the pulsating unidirectional voltage. Equations 1, 2, and 3 mathematically demonstrate this voltage- current relationship. Equation 1 sets forth the basic square law characteristic of the diode, i.e., the current is proportional to the square of the voltage. In Equation 2, this voltage is a sine wave signal. By expanding Equation 2 in accordance with standard trigonometric indentities, Equation 3 can be derived. The Equation 3 shows that the current has the above-mentioned D.C. component and a pure A.C. component whose frequency is double that of the impressed voltage before rectification.

At this point a brief description of the cadmium sulfide diode 12 employed in the present invention is in order. Briefly, the following steps are used in the fabrication of this diode. A single block of cadmium sulfide is cut, e.g., into rectangular parallelepipeds with dimensions of 0.3 centimeter by 0.25 centimeter by 0.05 centimeter. The pieces are then polished and etched and mounted on a glass slide, which is placed inside a vacuum chamber. A layer of oxide of silicon about 100 angstroms thick is evaporated onto a first 0.3 cm. x 0.25 cm. side of the crystal. Over this oxide there is deposited a heavy layer of gold over 1000 angstroms thick. A bed of indium is deposited onto this gold layer to form a contact with the gold. The silicon oxide-gold-indium combination forms the "non-ohmic contact" 17 of the diode 12. The ohmic contact is formed on a second side of said crystal opposite the non-ohmic contact 17 by depositing a second bed of indium thereon. This is called the "ohmic contact" 14. Note that this method of fabrication follows that disclosed by Jaklevic et al. in "Injection Electroluminescence in Cadmium Sulfide by Tunneling Films," Applied Physics Letters 2, 7, Jan. 1, 1963.

In order for a crystal to exhibit the above-mentioned square law characteristic it should have low trapping level densities and should exhibit the before mentioned "space-charge-limited" current flow. Trapping levels are dependent on the "prefection" of the crystal lattice structure. In practice this is limited by the crystal growing art. Crystals having high energy gaps, e.g., above 1.1 electron volt, will exhibit this space-charge-limited current characteristic. Cadmium sulfide satisfies this limitation. It has been shown that gallium arsenide also satisfies this limitation. It is believed that many III–V and II–VI crystal compounds may exhibit this square law diode characteristic (the Roman numerals represent groups in the classical periodic table of chemical elements).

Trapping level density is governed by lattice imperfections, as mentioned above and also by impurity concentrations. Lattice imperfections are manifested in electrical conductivity. It is believed that conductivities substantially lower than $10^{-6}$ inverse ohm-centimeters in cadmium sulfide would produce a current-voltage relationship which deviates from a perfect square law characteristic. It is further believed that for best results impurity concentrations should not substantially exceed $10^{12}$ parts per cubic centimeter. Notwithstanding the above recited factors which influence trapping level densities, in practice it has been found that the easiest way to establish that a crystal has low trapping level densities is by use of a curve tracer to verify that a particular crystal diode exhibits a desirable square law characteristic. This curve tracer method suggests that a low trapping level density may be defined as that level of trapping level density in a crystal at which the crystal will exhibit an acceptable square law characteristic.

A discussion of trapping level densities and related principles is set forth in "Photoconductivity of Solids," by Richard H. Bube, John Wiley, 1960, chapter 9, pp. 273–302.

Before proceeding further, it may be well to emphasize that according to the literature it is the bulk of the crystal which produces the square law effect. The operation of the diode does not depend on P-N junction characteristics. With the non-ohmic contact 17 of the above-described cadmium sulfide diode or any other suitable diode, biased positive with respect to the ohmic contact 14, the diode will exhibit its square law characteristic. However, these comments may or may not apply to other square law devices.

At this point it may be well to note that the preferred circuits which embody the present invention are "large signal" devices. This large signal concept may be understood by considering "small signal" devices whose successful operation require that signal amplitudes do not deviate from a quiescent point to a degree such that distortion will result. In "large signal" devices, there are no such limitations. The cadmium sulfide diode of the present invention exhibits its square law characteristic up to the tolerable power limits of the unit.

Figure 3:
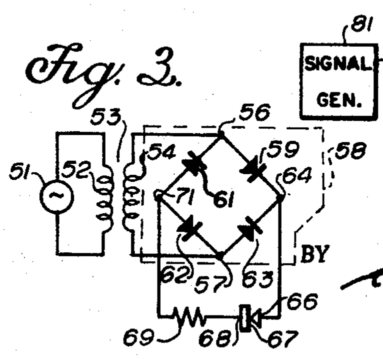

FIGURE 3 illustrates another important embodiment of the present invention. This figure shows a sine wave generator 51 coupled to the primary winding 52 of coupling transformer 53. A secondary winding 54 of transformer 53 connects to input terminals 56 and 57 of an unfiltered full wave rectifier 58 which rectifier comprises diodes 59, 61, 62 and 63. Positive terminal 64 of full wave rectifier 58 connects to the non-ohmic junction 66 of a cadmium sulfide diode 67. The ohmic junction 68 of cadmium sulfide diode 67 connects through low impedance resistor 69 to the negative output terminal 71 of full wave rectifier 58.

In operation sine wave generator 51 impresses a pure sine wave, through transformer 53, onto input terminals 56 and 57 of full wave rectifier 58. This rectifier fully rectifies the sine wave signal and presents a fully rectified sine wave in the form of a pulsating unidirectional signal at its output terminals 64 and 71. This fully rectified sine wave is then impressed across diode 67 which exhibits a square law characteristic. The current passing through this square law diode 67 also passes through resistor 69. Hence the voltage generated across resistor 69 as a result of this diode current serves as a direct measure of that current. As was explained above in conjunction with FIGURE 2, the alternating component of that voltage generated in resistor 69 will be a pure sine wave whose frequency is double that of the sine wave produced by sine wave signal source 51.

It should be noted that the circuit of FIGURE 3 will operate with a minimum of accompanying distortion if the resistance R of resistor 69 is reduced to a value where the aforesaid distortion lies within tolerable limits. Kirchoff's voltage law requires that for low distortion R $$<<\left(\frac{1}{i_{\max}}\right)^{1/2}$$

where $i_{\max}$ is the maximum current expected to flow through the diode. Recognition of this distortion factor highlights the advantage of that circuit shown in FIGURE 1, which circuit introduces virtually no distortion in the fully rectified sine wave signal impressed on the square law diode.

Figure 4:
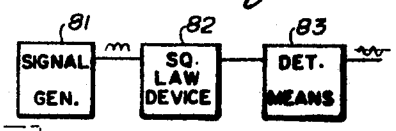

FIGURE 4 serves to demonstrate wide scope of the present invention with general applicability of the frequency doubling concept set forth in block diagram form. In the figure there is shown a fully-rectified sine wave signal generator 81 electrically connected to impress its fully rectified unfiltered sine wave voltage across square law device 82 which has a square law characteristic similar to that shown in FIGURE 2. Alternating current detecting means 83 electrically connects to device 82 to detect the alternating component of current generated therein.

Figure 5:
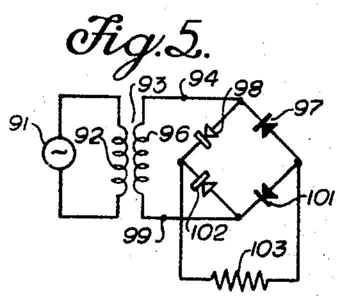
Figure 6:
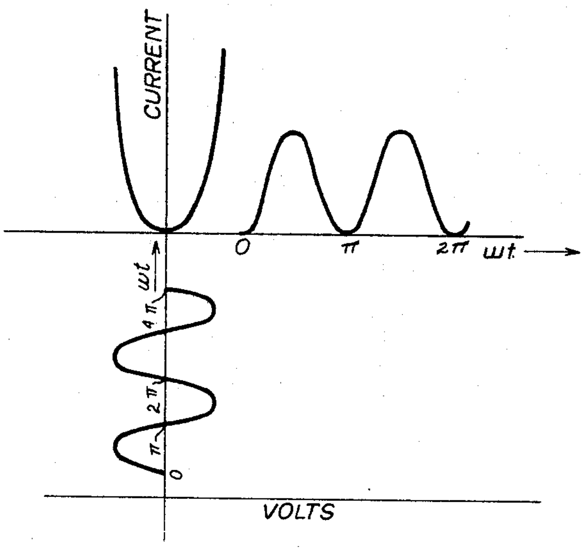

The circuit of FIGURE 5 serves to synthesize the symmetrical current-voltage curve shown in FIGURE 6. In FIGURE 5, sine wave generator 91 connects to primary 92 of transformer 93. Terminal 94 of secondary winding 96 of transformer 93 is electrically connected to the common junction of the cathode of rectifier 97 and the anode of a first cadmium sulfide diode 98. Terminal 99 of secondary winding 96 is electrically connected to the common junction of the cathode of rectifier 101 and the anode of a second cadmium sulfide diode 102. Resistor 103 electrically connects between the common junction of the cathodes of diodes 98 and 102 and the common junction of the anodes of rectifiers 97 and 101.

In operation sine wave signal generator 91 impresses an electrical signal on primary 92. This sine wave signal is transformed to secondary winding 96. When terminal 94 of secondary winding 96 is positive with respect to terminal 99, there is a current flowing from terminal 94 through diode 98, then through resistor 103 and then through rectifier 101 returning to terminal 99 of secondary winding 96. During the positive one half cycle of the sine wave appearing across secondary winding 96, there will appear across resistor 103 a first full cycle of the second harmonic frequency of the sine wave signal from generator 91. When terminal 99 of secondary winding 96 becomes positive with respect to terminal 94, current will flow from terminal 99 through diode 102, through resistor 103, through rectifier 97 returning to terminal 94 of secondary winding 96. During the negative half cycle of the sine wave appearing across secondary winding 96, there will appear across resistor 103 a second full cycle of a sine wave which is also a second harmonic of that sine wave from generator 91 appearing on secondary winding 96. This second cycle sine wave is displaced in time from the first cycle sine wave by an amount equal to the period of the second harmonic sine waves. The distortion characteristic of the circuit of FIGURE 5 is not affected by variations in the resistance of resistor 103. However, it is noted that the circuit of FIGURE 5 employs two cadmium sulfide diodes. To minimize the generation of harmonic distortion, the voltage current characteristics of these two diodes are closely matched.

Although rectifiers 97 and 101 could be eliminated, their use is recommended to minimize back bias conduction through diodes 98 and 102.

Figure 7:
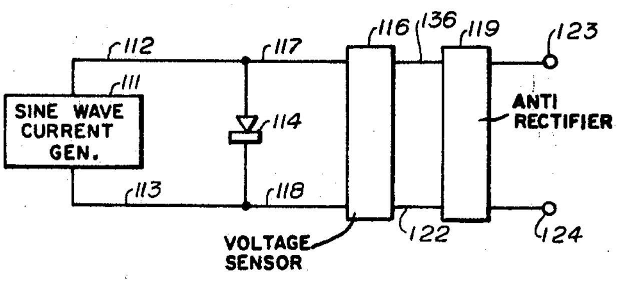
FIGURE 7 depicts, in block diagram form, a frequency halver embodiment of the frequency changer of the present invention.

Another advantageous species of the present invention is the frequency-halving device shown in FIGURE 7 in block diagram form. In that figure there is shown a sine wave current generator 111 electrically connected by way of conducting leads 112 and 113 to a cadimum sulfide diode 114. Diode 114 converts the sinusoidally varying current to a pulsating unidirectional voltage in the form of a rectified sine wave. Voltage sensor 116 connects across diode 114 by means of electrical connectors 117 and 118. Antirectifier 119 connects to voltage sensor 116 by means of electrical conducting leads 121 and 122.

In operation signal generator 111 produces a signal having a direct current component of a magnitude represented by the letter A, upon which is superimposed a sine wave current component having a zero to peak amplitude also of a magnitude represented by the letter A. The peak amplitude of this composite signal is seen to be 2A. In accordance with the response characteristics shown in FIGURE 2, this current when imposed across square law diode 114 generates a pulsing unidirectional voltage across the diode whose wave form is that of a fully rectified sine wave. When converted to an unrectified sine wave its frequency will be one half the frequency of the sine wave current signal from generator 111. Voltage detector 116 senses this fully rectified sine wave and sends the voltage signal in amplified form to antirectifier 119 which converts the signal to its unrectified form. There then appears at terminals 123 and 124 of antirectifier 119 a sine wave signal whose frequency is one half that of the sine wave frequency generated by signal generator 111. Hence, the circuit functions as a frequency halving device. Antirectifier 119 may be a device in the nature of conventional rotating-commutator type electrical machinery. Alternately antirectifier 119 may comprise sophisticated electronic switching and inversion circuitry wherein the consecutive half sine waves of the fully rectified sine waves from detector 116 are alternately switched to two separate channels, the voltage signal on one channel being then inverted, and the signals in both channels then being recombined in a summing junction network to provide a pure sine wave.

Figure 8:
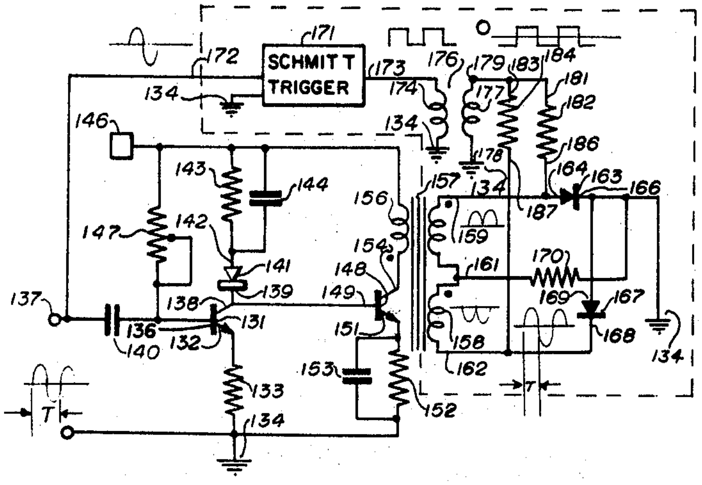
FIGURE 8 shows one detailed embodiment of the frequency halver of FIGURE 7.

FIGURE 8 schematically depicts one embodiment of a frequency halver. In the figure, a NPN transistor 131 has an emitter 132 connected through stabilization resistor 133 to ground terminal 134, a base 136 connected through capacitor 140 to input terminal 137 and a collector 138 connected to an ohmic junction 139 of large signal square law cadmium sulfide diode 141. A non-ohmic junction 142 of diode 141 connects through the parallel combination of collector resistor 143 and by-pass capacitor 144 to positive-voltage direct-current power source 146. Adjustable feedback resistor 147 connects between power source 146 and base 136. NPN transistor 148 has a base 149 connected to collector 138 of transistor 131, an emitter 151 connected through the parallel combination of series feedback stabilization resistor 152 and by-pass capacitor 153 to ground terminal 134, and a collector 154 connected through primary winding 156 of collector load transformer 157 to power source 146. Secondary winding 158 of transformer 157 has a first terminal 159, a center tap terminal 161 and a second terminal 162. Transformer 157 is wound such that the voltage appearing on terminal 162 has a voltage opposite in polarity to the voltage appearing on terminal 159. Rectifier diode 163 has an anode 164 connected to terminal 159 and a cathode 166 connected to ground 134. Rectifier diode 167 has a cathode 168 connected to terminal 162, and anode 169 connected to cathode 166 of diode 163. Output load resistor 170 connects from ground 134 to center tap terminal 161.

Schmitt trigger 171, which is referenced to ground 134, has an input lead 172 connected to input terminal 137 and has an output lead 173 connected through primary winding 174 of decoupling transformer 176 to ground 134. Secondary winding 177 of transformer 176 has a first terminal 178 connected to ground 134 and has a second terminal 179 connected to the common junction of terminal 181 of resistor 182 and terminal 183 of resistor 184. Terminal 186 of resistor 182 connects to anode 164 of diode 163. Terminal 187 of resistor 184 connects to cathode 168 of diode 167.

In operation, a sine wave voltage signal of a fundamental frequency F is imposed with reference to ground 134 on input terminal 137. This signal is coupled by capacitor 140 to base 136 where it is amplified by transistor 131. Since transistor 131, as connected, operates primarily as a current amplifier, there is generated in cadmium sulfide diode 141 a sine wave current. Feedback resistor 147 is adjusted such that a quiescent direct current flows in diode 141 whose amplitude is at least as large as the zero-to-peak amplitude of the sine wave current in diode 141. It is then seen that current will always flow from non-ohmic contact 142 to ohmic contact 139, a condition which apparently is necessary in order for a cadmium sulfide diode to exhibit its square law characteristic.

Capacitor 144 serves to by-pass resistor 143 to provide an A-C ground at non-ohmic contact 142 of diode 141. Resistor 133 merely serves as a biasing stabilizing series feedback element.

The fully rectified alternating voltage response of square law diode 141 to the alternating current appears at collector 138 of transistor 131. This fully rectified alternating voltage signal passes directly to base 149 of transistor 148 where it passes to emitter 151, through by-pass capacitor 153 to ground terminal 134. This signal is amplified in transistor 148 and is impressed across primary winding 156. Note that transistor 148 and its associated circuitry serves to detect the voltage generated across square law diode 141 and to isolate the diode from the "antirectifier" next to be described.

The signal appearing across primary winding 156 is transformed to secondary winding 158 where terminal 159 carries a positive polarity version of the fully rectified signal with respect to center tap terminal 161 and terminal 162 carries a negative polarity version of this fully rectified signal. The current from terminal 159 passes through diode 163 and through load resistor 170 to center tap terminal 161. The current from terminal 162 passes through diode 167 and also through load resistor 170 in a direction opposite to that current from terminal 159, to center tap terminal 161.

Now if diode 163 can be rendered non-conductive except during the even numbered alternate cycles of the fully rectified sine wave signal appearing at secondary winding 158 while at the same time diode 167 can be rendered synchronously with respect to diode 163 non-conductive except during the odd numbered alternate cycles of the rectified sine wave signal, there will appear across resistor 170, a pure "unrectified" sine wave voltage. The frequency ($F/2$) of this pure sine wave voltage will be one-half the frequency (F) of the sine wave signal impressed on input terminal 137. Hence we will have a frequency halver. The circuitry next to be described serves to so synchronously switch diodes 163 and 167 "on" and "off."

The sine wave signal impressed on input terminal 137 is converted to a square wave by Schmitt trigger 17. This square wave signal, which is either "in-phase" or 180° "out-of-phase" with the input signal, passes through transformer 176 and is impressed on diodes 163 and 167 through isolation resistors 182 and 184, respectively. Note that the repetition rate of this square wave signal is one-half that of the fully-rectified sine wave appearing across transformer 157. Now when the square pulse is in its negative region, a negative voltage is impressed on anode 164 of diode 163 and the diode will be driven into its reverse-bias non-conducting region. At this time the only signal appearing across load resistor 170 will be the negative half sine wave signal from terminal 162. Next when the square pulse is in its positive region, a positive voltage is impressed on cathode 168 of diode 167 and the diode is driven into its reverse-bias non-conducting region. At this time the only signal appearing across load resistor 170 will be the positive half sine wave from terminal 159. The result of this alternate switching of diodes 163 and 167 is that a pure unrectified sine wave signal will appear across resistor 170. The frequency of this signal will be one-half the frequency of the sine wave signal at input terminal 137.

It should be noted that any comparable alternating switching arrangement may serve as the "antirectifier" for this frequency halver. The antirectifier is not limited to the use of the above-described diode switching arrangement, Nor is it limited to the center-tapped secondary winding configuration. In general, the antirectifier may be defined as any means which separates into two groups alternate cycles of a fully rectified sine wave signal, then inverts the signals in one of these groups, and then recombines the signals of both groups to form a pure unrectified sine wave. The term "pure" is used to denote signals which comprise only a fundamental frequency with no substantial harmonics.

Although the invention has been described above in terms of specific embodiments, it should be construed liberally, and it will be understood that various changes and modifications may be made without departing from the spirit and scope of the invention as defined in the appended claims.

What is claimed is:

1. A device for generating harmonics of the frequency of sinusoidal electrical signals comprising:

(a) an unfiltered full wave rectifier means responsive to a first sinusoidal electrical signal by converting said sinusoidal signal to pulses in the form of an unidirectional rectified sinusoidal signal; and (b) a two terminal large signal square law characteristic electronic device connected to receive said rectified sinusoidal signal and convert each pulse thereof to a second sine wave signal having a frequency multiply related to said first signal.

2. The apparatus as recited in claim 1 further comprising an electrical signal detection means operatively connected to the output of said square law device to sense said second sinusoidal signal.

3. An electronic device for generating pure harmonics of a fundamental sinusoidal electrical signal comprising:

(a) cadmium sulfide crystal diode means provided with a non-ohmic junction at one face and an ohmic junction at an opposite face;

(b) an unfiltered full wave rectifier means adapted to receive a first sine wave signal and responsively generate a fully rectified sine wave voltage signal across first and second output terminals, said first terminal being biased to be electrostatically positive with respect to said second terminal, said first terminal being electrically connected to said non-ohmic junction of said diode and said second terminal being electrically connected to said ohmic junction; and (c) means for detecting the alternating component of current having a multiple frequency relationship to said first signal and produced in said diode.

4. In an electronic device for generating subharmonics of a fundamental electrical sine wave signal, the combination comprising:

(a) an electrical sine wave signal generator productive of a sine wave signal current having a frequency, superimposed upon a direct current, the peak magnitude of said sine wave signal being at least equal to double the magnitude of said direct current;

(b) a two-terminal large signal square-law device adapted to be operatively driven by said electrical sine wave signal current generator and connected to said generator to receive said signals therefrom, and generate an unfiltered, rectified sinusoidal signal in response thereto;

(c) an anti-rectifier, operatively transconnected to said square-law device, to receive said unfiltered, rectified sinusoidal signal, and convert said unfiltered, rectified sinusoidal signal to a sine wave signal one-half the frequency of said sine wave signal current from said electric signal generator.

5. An electronic device for generating sub-harmonics of a fundamental electrical sine wave signal comprising:

(a) an electrical signal generator productive of a sine wave current superimposed upon a direct current, the peak magnitude of said sine wave current at least equal to double the magnitude of the direct current component;

(b) a semiconductor comprising a cadmium sulfide crystal having low trapping level densities and provided with ohmic and non-ohmic contacts connected to receive said currents from said signal generator and generate an unfiltered rectified sine wave voltage signal in response thereto; and (c) an antirectifier operatively transconnected said semiconductor to receive said voltage signal.

6. In an electronic device for generating subharmonics of a sine wave signal, the combination comprising:

(a) summation means adapted to receive a sine wave current signal having a zero to peak amplitude A and superimopse said sine wave signal onto a direct current signal at least of amplitude A to produce a composite current signal, said summation means provided with an output terminal to carry an analog of said composite current signal;

(b) a square law device comprising a cadmium sulfide crystal provided with ohmic and non-ohmic contacts, said square law device operatively disposed to conduct said composite current from said non-ohmic contact to said ohmic contact; and (c) an antirectifier operatively connected between said ohmic and non-ohmic contacts.

7. An electronic circuit for doubling the frequency of an input sine wave signal comprising:

(a) a cadmium sulfide large signal square law diode having a non-ohmic junction and an ohmic junction, said ohmic junction being connected to a ground terminal;

(b) a constant current generator having first and a second terminal with current flowing from said first terminal to said second terminal, said second terminal being electrically connected to said ground terminal and said first terminal being electrically connected to said non-ohmic junction;

(c) an electronic amplifier having an input terminal, a first output terminal whose voltage closely follows any voltage impressed on said input terminal, and a second output terminal whose voltage is an analog of the alternating component of current flowing from said first output terminal, said first output terminal being directly electrically connected to the common juncture of said non-ohmic junction and said first terminal of said current generator, said amplifier being fashioned such that a direct current continuously flows out of said first output terminal of a magnitude at least equal to the current flowing in said constant current generator; and (d) full wave rectifier means provided with input terminals adapted to receive an electrical sine wave voltage signal and provided with a first negative output terminal referenced to ground and a second positive output terminal which carries a fully rectified sine wave voltage in response to any input sine wave voltage impressed across said input terminals, the voltage appearing on said first output terminal being adjusted to be electrically positive with respect to said second output terminal, said first output terminal being directly electrically connected to said input terminal of said amplifier.

8. An electronic circuit for doubling the frequency of an input sine wave signal comprising:

(a) a square law diode comprising a cadmium sulfide crystal having low trapping level densities and provided with an ohmic contact and a non-ohmic contact, said ohmic contact being directly electrically connected to a ground terminal;

(b) a constant current generator provided with a first terminal connected to said non-ohmic contact and provided with a second terminal connected to said ground terminal, (c) a Darlington transistor amplifier including a first and second NPN transistor each having base, emitter and collector electrodes, the emitter electrode of said first transistor electrically connected to said non-ohmic contact of said diode, the collector electrode of said first transistor electrically connected to an output terminal; and (d) an unfiltered full wave rectifier comprising a coupling transformer having a primary winding adapted to be connected to a sinusoidal voltage source and having a secondary winding provided with a first and a second output terminal and a center tap terminal adapted to be connected to an adjustable source of constant positive voltage. A first rectifier diode provided with cathode and anode terminals, said anode terminal connected to said first terminal of said secondary winding; a second rectifier diode provided with an anode terminal connected to said second terminal of said secondary winding and provided with a cathode terminal connected to the cathode terminal of said first rectifier diode and a current limiting isolation resistor having a first terminal connected to the common junction of said cathode terminals of said first and second rectifier diodes and having a second terminal connected to said base terminal of said second transistor.

9. An electronic circuit for doubling the frequency of an input sinusoidal electrical signal comprising:

(a) a full wave rectifier defining a positive cycle unilateral-current-direction conduction path and a negative - cycle unilateral - current - direction conduction path, said rectifier provided with input terminal means to receive said sinusoidal electrical signal;

(b) a large signal square law diode electrically connected to receive current signals both from said positive cycle path and from said negative cycle path; and (c) means to detect the electrical response of said square law diode to signals from said conduction paths.

10. An electronic circuit for doubling the frequency of an input sine wave signal comprising:

(a) a first rectifier diode having anode and cathode terminals;

(b) a second rectifier diode provided with anode and cathode terminals, said anode terminal being connected to said anode terminal of said first rectifier diode;

(c) a third rectifier diode provided with a cathode terminal and provided with an anode terminal connected to said cathode terminal of said first rectifier diode;

(d) a fourth rectifier diode provided with a cathode terminal connected to said cathode terminal of said third rectifier diode and provided with an anode terminal connected to said cathode terminal of said second rectifier diode;

(e) a coupling transformer having primary and secondary windings, said secondary winding provided with a first terminal connected to said anode terminal of said fourth diode, and provided with a second terminal connected to said anode terminal of said third diode, said primary winding provided with first and second terminals adapted to be connected to a source of sine wave voltage;

(f) a square law diode comprising a cadmium sulfide crystal provided with both an ohmic contact and a non-ohmic contact;

(g) a load resistor electrically serially connected to said diode to form a diode-resistor serial combination said serial combination transconnected from the anode terminal of said first diode to the cathode terminal of said fourth diode such that said ohmic contact is electrically closer than said non-ohmic contact to said anode terminal of said first diode; and (h) an output terminal means connected across said load resistor.

11. An electronic circuit for doubling the frequency of an input sinusoidal electrical signal comprising:

(a) a full wave rectifier defining a first-positive-cycle unilateral-current-direction conduction path and a second negative - cycle unilateral - current - direction conduction path, said rectifier provided with input terminal means to receive said sinusoidal electrical signal, (b) a first large signal square law diode electrically serially disposed in said first conduction path;

(c) a second large signal square law diode electrically serially disposed in said second conduction path; and (d) an electrical impedance disposed to receive electrical signals from both said first and said second conduction paths.

12. An electronic circuit for doubling the frequency of an input sine wave signal comprising:

(a) a first square law diode comprising a cadmium sulfide crystal having low trapping level densities and provided with both an ohmic contact and a non-ohmic contact;

(b) a second square law diode comprising a cadmium sulfide crystal having low trapping level densities and provided with both an ohmic contact and a non-ohmic contact, said ohmic contact of said second square law diode being connected to said ohmic contact of said first square law diode;

(c) a first rectifier diode having a cathode and an anode, said cathode connected to the non-ohmic junction of said first square law diode;

(d) a second rectifier diode provided with an anode connected to said anode of said first rectifier diode and provided with a cathode connected to said anode of said second square law diode;

(e) a load resistor having a first terminal connected to the anodes of said rectifying diodes and having a second terminal connected to the ohmic contacts of said square law diodes, said output resistor being provided with output terminals for connecting voltage sensing means across said output resistor; and (f) a coupling transformer having a primary and a secondary winding, said secondary winding provided with a first terminal connected to the cathode of said first rectifier diode and provided with a second terminal connected to the cathode of said second rectifier diode, said primary winding being adapted to receive a sine wave voltage signal.

References Cited

UNITED STATES PATENTS

| | | | |
|---|---|---|---|
| 3,093,752 | 6/1963 | Christensen | 307—88.5 |
| 3,044,004 | 7/1962 | Sicard | 321—4 |
| 3,135,926 | 6/1964 | Bockemuehl | 330—38 |
| 3,185,935 | 5/1965 | White | 333—30 |
| 3,202,840 | 8/1965 | Ames | 307—88.5 |
| 3,261,991 | 7/1966 | Lash | 307—88.5 |

ARTHUR GAUSS, *Primary Examiner.*

S. D. MILLER, *Assistant Examiner.*